United States Patent [19]  
Ciuffini

[11] 4,126,457  
[45] Nov. 21, 1978

[54] EVAPORATION TECHNIQUE FOR PRODUCING HIGH TEMPERATURE PHOTORECEPTOR ALLOYS

[75] Inventor: Anthony J. Ciuffini, Rochester, N.Y.

[73] Assignee: Xerox Corporation, Stamford, Conn.

[21] Appl. No.: 365,353

[22] Filed: May 30, 1973

[51] Int. Cl.² .......................................... G03G 5/082
[52] U.S. Cl. .................................. 96/1.5 R; 427/76; 75/134 H
[58] Field of Search ....................... 96/1, 1.5; 117/107

[56] References Cited  
U.S. PATENT DOCUMENTS

| 2,739,079 | 3/1956 | Keck | 96/1.5 |
| 2,803,542 | 8/1957 | Ullrich, Jr. | 96/1.5 |
| 3,785,806 | 1/1974 | Henriksson | 96/1.5 |
| 3,861,913 | 1/1975 | Chiou | 96/1.5 |

FOREIGN PATENT DOCUMENTS 1,135,460 12/1968 United Kingdom ................. 96/1.5

Primary Examiner—Roland E. Martin, Jr.  
Assistant Examiner—John L. Goodrow  
Attorney, Agent, or Firm—James J. Ralabate; James P. O'Sullivan; John E. Crowe

[57] ABSTRACT

A flexible photoreceptor having improved thermal stability and durability and a process for obtaining the photoreceptor by evaporating and condensing selenium-containing photoconductive materials in a profile of increasing arsenic concentration onto a flexible substrate from a plurality of selenium alloy baths of varying concentrations, individually or collectively heated while simultaneously heating and maintaining the temperature of the substrate or interface-substrate layers during evaporation and condensation at no less than the glass transition temperature of the selenium alloy of lowest arsenic concentration to be evaporated from the donor source and not less than about 85° C.

11 Claims, No Drawings

EVAPORATION TECHNIQUE FOR PRODUCING HIGH TEMPERATURE PHOTORECEPTOR ALLOYS

BACKGROUND

The formation and development of images on the imaging surfaces of photoconductive materials by electrostatic means is well-known (Carlson, U.S. Pat. No. 2,297,691). The best known of the commercial processes, more commonly known as xerography, forms a latent electrostatic image on the surface of an imaging layer by uniformly electrostatically charging the surface in the dark, and then exposing the charged surface to a light and shadow image. The light-struck areas of the imaging layer are thus made substantially more charge-conductive and the electrostatic charge is selectively dissipated in such areas. After light exposure, the latent electrostatic image remaining on the imaging surface (i.e. a positive electrostatic image) is made visible by contacting with finely divided colored or black electroscopic material, known in the art as "toner". Toner is principally attracted to those areas on the image bearing surface which retain the original electrostatic charge and thereby form a visible positive image.

In structure, the conventional xerographic plate normally has a photoconductive insulating layer overlaying the conductive base or substrate and frequently an inteface or charge blocking layer between the two.

The photoconductive layer may comprise a number of materials known in the art. For example, selenium-containing photoconductive material such as vitreous selenium, or selenium modified with varying amounts of arsenic are found very useful in commercial xerography. Generally speaking, the photoconductive layer should have a specific resistivity greater than about $10^{10}$ ohm-cm (preferably $10^{13}$ ohm-cm) in the absence of illumination. In addition, resistivity should drop at least several orders of magnitude in the presence of an activating energy source such as light. As practical matter, a photoconductor layer should support an electrical potential of at least about 100 volts in the absence of light or other actinic radiation, and may usefully vary in thickness from about 10 to 200 microns.

In addition to the above, photoconductive layers will also normally exhibit some reduction in potential or voltage leak, even in the absence of an activating light. This phenomenon, known as "dark decay", will vary somewhat with the amount of usage of the photoreceptor. The existence of this problem is well-known and has been controlled, where necessary, by incorporation of an interface or barrier layer such as a very thin dielectric film or layer between the substrate and the photoconductive insulating layer. U.S. Pat. No. 2,901,348 to Dessauer et al utilizes a layer of aluminum oxide in this manner. Also of interest are thin films of a blocking resin interface such as a polybenzimidazole, a polyester, a polyurethane, a polycarbonate, an epoxy resin, or mixtures thereof, (0.1 to 2 microns). With some limitations, such blocking interface layers can effectively function not only to permit a photoconductive layer to support a charge of relatively high field strength, and to substantially minimize dissipation (dark decay) in the absence of illumination, but also to aid in cementing the photoconductive layer to the substrate. When activated by illumination, however, the interface-photoconductor layer combination must still be sufficiently conductive to permit dissipation or discharge of a substantial portion of the applied charge through the photoconductive layer. The above criterian is particularly important when one attempts to utilize xerographic processes in modern automatic copiers operating at high speeds. Flexible photoreceptors in the form of belts are typical of such usage. There are, however, serious technical problems inherent in their use. For example, high speed automatic cycling conditions require very fast charge dissipation under light exposure and also demand very strong adhesion between the photoconductor, the interface layer (where present) and the flexible substrate. In this connection, it has been well demonstrated that flexing of a photoreceptor for an extended period will inevitably crack substrate-photoconductor interfaces and result in the flaking off or spalling of sections of the photoreceptor.

The above problems are particularly acute when the newer, more sensitive inorganic selenium photoconductor alloys such as arsenic-rich selenium alloys (ref. U.S. Pat. Nos. 2,822,300, 2,803,542 and 3,312,548) are utilized as photoconductors. Such materials are brittle and best applied by condensing the vaporized alloy onto a prepared interface-substrate under vacuum. The heat of condensation of such alloys, however, is substantial, and substrates (i.e. thin foils) as well as optional thin polymeric interface layers are temperature sensitive. Moreover, there is no commercial product or knowledge in the art which suggests a way of completely avoiding the cracking and spalling problem with a flexible photoreceptor.

It is an object of the present invention to obtain improved photoreceptors with photoconductive surfaces having substantially less surface defects such as pitting and also adhering well to the substrate and to interface layers.

It is also an object of the present invention to obtain flexible, particularly belt-type photoreceptors having improved light sensitivity, stability and durability.

It is a still further object of the present invention to efficiently utilize arsenic-rich selenium alloys as photoconductors in successful working combination with flexible metal substrates having different coefficients of expansion than the photoconductor layer.

THE INVENTION

The above and other objects are obtained in accordance with the present invention by effecting the evaporation and condensation of at least one arsenic-rich selenium photoconductor layer from a heated donor source in a profile of increasing arsenic concentration onto a prepared substrate or interface-substrate combination. Condensation is effected by utilizing as heated donor source during the evaporation and condensation, a plurality of receptacles containing selenium alloy of varying concentrations within the range of about 0%-40% arsenic by weight. For the purposes of this invention, the receptacles can be individually or collectively heated by heating means to provide at least substantial partial evaporation from two or more receptacles simultaneously onto substrate or interface-substrate layers.

The evaporation-condensation step as above described is effected while simultaneously heating and maintaining the temperature of the substrate or interface-substrate layers during evaporation and condensation at a temperature no less than about the glass transition temperature of the selenium alloy of lowest arsenic concentration to be evaporated from the donor source and not less than about 85° C.

For purposes of the present invention, particularly where flexible metal substrates are likely to contain imperfections such as holes or pits capable of trapping liquids and gasses, it is preferred, but not mandatory, that the substrate or interface-substrate be pretreated. In this step the substrate is preheated by conventional means such as glow discharge to at least 50° C. before applying the photoconductive material. When used, the preheating step is usefully carried out for a period of about 15-45 minutes, under vacuum and/or in an inert gas such as argon and preferably at a temperature of about 50°-150° C. This treatment helps to obtain the later even application of photoconductor material and avoids the formation of pits or weak areas on or between the selenium photoconductor and the substrate caused by the heating and escape of trapped gasses during condensation of the photoconductor. This degassing step is found particularly useful when the photoreceptor is an electrolytically-formed belt such as a nickel belt in combination with a polymeric interface layer.

While a variety of flexible metal or metal-covered substrates can be used within the scope of the present invention, it is found that thin flexible belts of aluminum, steel, brass, nickel or the like are generally satisfactory.

Because of the above-indicated brittleness of arsenic-rich photoconductor layers, it is found useful, although not always necessary to utilize belts of such materials which are first coated with a thin adhesion-promoting interface of about 0.5-3 microns of the types indicated above. These can be applied to the substrate by usual means such as coating, draw coating, dip coating or flow coating. Suitable solvents such as cyclohexanone can later be conveniently removed by drying or washing. Such techniques and interfaces are described, for instance, in Belgian Pat. No. 784,453.

Polymeric resins acceptable for the above purpose include, the above-mentioned polybenzimidazoles, polycarbonates, polyesters, polyurethanes, etc., inclusive of blends. The interface layer can also optionally contain additives exemplified by small amounts of conductive or photoconductive pigments such as copper phthalocyanines, zinc oxides (electrography grade), cadmium sulfoselenide and metal-free phthalocyanines.

The heated donor source, for purposes of the present invention, usefully consists of a plurality of open receptacles capable of holding selenium alloys of varying concentrations. Such receptacles can be of stainless steel and are usefully joined together as a multi-compartmented boat for ease in introduction and removal from the vacuum chamber. For purposes of this invention, it is useful if each individual receptacle be capable of holding a loading (i.e. amount of particular alloy) of at least about 60 grams of alloy for each substrate to be coated in the vacuum chamber. The actual number and amount used, however, may vary considerably, depending upon the desired rate of gradation or profile (i.e. increasing arsenic concentration with increased distance from the substrate) and the desired thickness of maximum arsenic condensate.

It is also useful, although not mandatory, for purposes of the present invention, to modify conventional photoconductor vacuum evaporation techniques to the extent of providing a plurality of individually heated and controlled alloy receptacles to maintain evaporation rates sufficient to assure evaporation of representative amounts of both arsenic and selenium from chosen receptacles without splattering any of the alloys and to assure at least partial continuous evaporation from at least two receptacles simultaneously.

In addition, it is necessary to provide suitable mounting means for substrates in convenient proximity to the alloy-containing receptacles and a second heating means for controlling the substrate or interface-substrate temperature before and during the evaporation-condensation step. Rotatable mandrels, turning at about 6-12 revolutions/minute, for instance, are found suitable for holding a belt-type substrate in position for even condensation of photoconductor materials.

Suitable second heating means can include glowing tungsten wires or other conventional heating devices suitable for maintaining a relatively constant substrate temperature during the evaporation condensation step.

Other than the above-indicated modifications, it is found generally acceptable to utilize conventional vacuum deposition techniques with a vacuum oven operating at a pressure of about $5 \times 10^{-4}$ Torr. U.S. Pat. Nos. 2,803,542, 2,901,348, and 2,753,278 disclose suitable art-recognized procedures of this type. If desired, however, the evaporation-condensation step can be carried out in the presence of an inert gas or even under ambient conditions.

It is also possible to vary the concentration and number of selenium alloys needed to carry out the present invention. It is important, however, that the selenium alloy first condensed onto the flexible substrate or interface-substrate have relatively small amounts of arsenic. It is convenient, for instance, to have one or more receptacles well loaded with an alloy containing about 0%-5% arsenic, and 2 or more receptacles in the ranges 10%-20% and 35%-40% arsenic alloys.

Since the heat of condensation rapidly increases with an increase in arsenic content, the amount and loading of low arsenic alloys in the receptacles is particularly important in order to assure that a stepwise or graduated increase in arsenic is achieved relative to the thickness of the condensate layer. Optimally, the concentration of arsenic should vary from about 0%-20% over the first 15-30 microns of deposit and thereafter rapidly increase in concentration to a maximum of about 35%-40% arsenic. The thickness of the condensate having maximum arsenic concentration can extend from about 20-40 microns and the overall thickness of the photoconductor can vary from about 50-70 microns without significant loss in efficiency or durability of the final product.

By initially heating only receptacles containing low arsenic or no arsenic, or by evaporating and condensing the first 10-15 microns at a very slow rate from one or more higher arsenic-containing alloys, it is possible to favor an initial deposition containing little arsenic. In either case it is possible to obtain the excellent photoconductor efficiency of arsenic-rich selenium together with satisfactory adhesion to a flexible substrate or interface-substrate without damage.

In the above-described two arrangements, the substrate or interface-substrate is maintained at the glass transition temperature of the alloy to be initially condensed over, but not less than about 85° C. Therefore, if the first donor receptacle contains pure selenium or selenium and trace amounts of a halogen, the substrate temperature must be kept at 85° C. (the minimum temperature). In this situation, the glass-transition point is substantially lower than 85° C. In each case, the temperature within the donor alloy (the receptacle) is necessarily much higher than the temperature to which the substrate is subjected.

By way of further example, if a 20% arsenic alloy is being evaporated over initially to obtain the first few microns of condensate on the substrate, the substrate should be maintained at about 100° C. (i.e. the glass transition temperature of the 20% alloy).

Alloy baths suitable for use in the present invention can include 0%–40% arsenic plus 0 ppm –10,000 ppm of a halogen dopant such as chlorine or iodine and/or other additives as suggested, for instance, in U.S. Pat. No. 3,312,548 of Mayer, U.S. Pat. No. 2,822,300 of Straughan, and in Belgian Patent 784,453 of Angeline. Such alloys are conveniently obtained in the manner disclosed in Mayer, by heating desired amounts of selenium, arsenic, etc. in a sealed container to a temperature of about 825° C. for at least about 30 minutes. In this general manner, it is possible to obtain any one of the desired selenium-arsenic alloys to carry out the present invention.

The following examples further demonstrate the present invention with respect to a process for obtaining the components and improved photoreceptor.

EXAMPLE I (A) A mixture of 5% by weight arsenic, about 95% by weight selenium and 1,000 ppm of iodine is sealed into a Pyrex vial and reacted for about 3 hours at 525° C. in a rocking furnace. After cooling, the resulting selenium alloy is recovered and utilized as hereinafter indicated in Example II.

(B) A mixture of 17.5% by weight arsenic, about 82.5% by weight selenium and 1,000 ppm iodine is reacted and utilized as in Example I(A).

(C) A mixture of 20% by weight arsenic, about 80% by weight selenium and 1,000 ppm iodine is reacted and utilized as in Example I(A).

(D) A mixture of 40% by weight arsenic and about 62% by weight selenium and 1,000 ppm iodine is reacted and utilized as in Example I(A).

EXAMPLE II (Sample 1)

A nickel alloy test belt having a thickness of about 4.5 mil(0.0045 inches), a width of 5 inches and a circumference of 65 inches is cleaned and rinsed in deionized water, air dried, painted with a 1% polycarbonate solution and dried, mounted on a circular rotatable mandrel, and placed in a vacuum oven equipped with glowing tungsten wire heater and 4 stainless steel crucibles with attached electrical resistance heating units. The crucibles contain selenium alloys with 5% (15 grams), 17.5% (30 grams), and 40% (60 grams) by weight arsenic prepared in accordance with Examples IA-D supra. The oven is then evacuated to about $5 \times 10^{-4}$ Torr and the substrate heated to a temperature of about 100° C. for 30 minutes. Thereafter, the substrate is maintained at about 85° C. and the 5% and 17.5% arsenic alloys of Example IA-B are heated to 300° C. for about 21 minutes. Therafter, the 17.5% and 20% arsenic alloys are heated at 380° C. for 21 minutes and the 17.5%, 20% and 40% arsenic alloys then heated to a temperature of 420° C. for 21 minutes. After cooling, the nickel belt is removed from the vacuum oven and tested with respect to electrical and physical properties. The results are reported in Table I below.

EXAMPLE III (Sample 2)

An identical belt is cleaned, mounted and coated under the same conditions as in Example II except that a single large crucible containing 105 grams of 40% arsenic alloy is directly evaporated at 420° C. for 60 minutes. The resulting coated belt is removed, tested and the electrical and physical properties reported in Table I below.

EXAMPLE IV (Sample 3)

Example II is repeated except that the nickel belt is initially cleaned and rinsed, then painted with a 2.6% polycarbonate-polyurethane solution at a ratio of about 4 to 1 and air dried. The results are reported in Table I below.

EXAMPLE V (Sample 4)

Example IV is repeated except that no preheating step is effected prior to the evaporation and condensation step. The results are reported in Table I below. Several surface pits were noted on the coated belt.

Table I

| Sample | Micro. Exam. ** | % Charge Ret'd (900 v.) *** | % Dark Discharge (900 v., 4 sec.) | Mandrel Test* (9" dia. cyl., 25° C) |
|---|---|---|---|---|
| 1 (Ex. II) | Ex. | 0 | 14 | Passed |
| 2 (Ex. III) | Vg. | 5 | 11 | Failed |
| 3 (Ex. IV) | Ex. | 15 | 10 | Passed |
| 4 (Ex. V) | F** (Pitted) | 0 | 10 | Passed |

*Bent five times over a cylinder having 9" diameter and checked for cracks or spalls.
**Ex = excellent photoconductor surface
Vg = very good photoconductor surface
F = failed; pitted photoconductor surface
***200 Watt tungsten-iodine lamp; 10 second exposure at 25 cm.

EXAMPLE VI

Example IV is repeated using 5 flexible brass substrates (Samples 5-9) but utilizing a first alloy donor varying in loading and % arsenic to obtain the following profiles.

| Sample | Alloy % As | Loading (grams) | Outer Deposit 40% As (microns) | Total Deposit P.C. (microns) |
|---|---|---|---|---|
| 5 | 20% | 5 | 45 | 60 |
| 6 | 15% | 10 | 40 | 60 |
| 7 | 10% | 15 | 30 | 60 |
| 8 | 5% | 20 | 25 | 60 |
| 9 | 0% | 25 | 20 | 60 |

No indication of damage to the polycarbonate substrate was observed and no pits or surface defects were noted. All samples passed the mandrel test.

While the above Examples are directed to preferred embodiments of the invention, it will be understood that the invention is not limited thereby.

What is claimed is:

1. In a process for obtaining a flexible photoreceptor having improved thermal stability and durability comprising a flexible metal-or metal-coated substrate and at least one arsenic-rich selenium photoconductor layer obtained by effecting evaporation and condensation of selenium alloy from a heated donor source;

the improvement comprising, utilizing as heated donor source during evaporation and condensation, a plurality of receptacles containing selenium alloy of varying concentrations within the range of about 0%–40% arsenic by weight, the receptacles being individually or collectively heated by heating means to provide at least substantial partial evaporation from two or more receptacles simultaneously onto substrate or interface-substrate layers; to effect a profile of increasing arsenic concentration from the substrate or interface-substrate layers while
simultaneously heating and maintaining the temperature of the substrate or interface-substrate layers during evaporation and condensation, at no less than about the glass transition temperature of the selenium alloy of lowest arsenic concentration to be evaporated from the donor source and not less than about 85° C.

2. The process of claim 1 wherein the substrate initially contains an applied polymeric interface layer.

3. The process of claim 2 wherein substrate or interface-substrate layers are preheated to at least 50° C. before applying photoconductive material.

4. The process of claim 2 wherein the interface layer is a polyester, a polycarbonate, a polybenzimidazole, a polyurethane, an epoxy resin or mixtures thereof.

5. The process of claim 1 wherein the substrate is maintained at a temperature of about 85° C.–150° C. at least during evaporation and condensation of photoconductive material under vacuum.

6. The process of claim 3 wherein the substrate is maintained at a temperature of about 85° C.–150° C. at least during evaporation and condensation of photoconductive material under vacuum.

7. The process of claim 1 wherein the donor source comprises at least three selenium-arsenic alloy baths and the evaporation and condensation is effected under vacuum or in the presence of an inert gas.

8. The process of claim 2 wherein the interface layer is a copolymer.

9. The process of claim 1 wherein the metal substrate or metal coat on the substrate is aluminum, nickel or brass.

10. The process of claim 1 wherein the metal substrate is a nickel belt.

11. The process of claim 3 wherein the metal substrate is a nickel belt.

* * * * *